US007415118B2

(12) United States Patent
Sarpeshkar et al.

(10) Patent No.: US 7,415,118 B2
(45) Date of Patent: Aug. 19, 2008

(54) SYSTEM AND METHOD FOR DISTRIBUTED GAIN CONTROL

(75) Inventors: Rahul Sarpeshkar, Arlington, MA (US); Lorenzo Turicchia, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 823 days.

(21) Appl. No.: 10/625,360

(22) Filed: Jul. 23, 2003

(65) Prior Publication Data

US 2004/0136545 A1 Jul. 15, 2004

Related U.S. Application Data

(60) Provisional application No. 60/398,253, filed on Jul. 24, 2002.

(51) Int. Cl.

| | |
|---|---|
| ***H03G 5/00*** | (2006.01) |
| ***H04B 15/00*** | (2006.01) |
| ***H04R 25/00*** | (2006.01) |
| ***G10L 21/00*** | (2006.01) |
| ***G10L 13/06*** | (2006.01) |
| ***G06F 17/00*** | (2006.01) |

(52) U.S. Cl. ....................... 381/98; 381/94.1; 381/94.3; 381/312; 381/320; 381/317; 704/226; 704/266; 700/94

(58) Field of Classification Search ................. 381/312, 381/317, 320, 94.1, 94.2, 94.3, 98, 314, 330, 381/313, 60, 61; 704/500, 500.1, 266; 607/56; 600/559; 700/94

See application file for complete search history.

(56) References Cited

U.S. PATENT DOCUMENTS

| | | | | |
|---|---|---|---|---|
| 4,633,501 | A * | 12/1986 | Werrbach | 381/100 |
| 5,027,410 | A * | 6/1991 | Williamson et al. | 381/320 |
| 5,473,759 | A * | 12/1995 | Slaney et al. | 704/266 |
| 5,757,932 | A * | 5/1998 | Lindemann et al. | 381/312 |
| 6,231,604 | B1 * | 5/2001 | von Ilberg | 623/10 |
| 6,690,205 | B2 * | 2/2004 | Alvandpour | 326/98 |
| 6,873,709 | B2 * | 3/2005 | Hou | 381/106 |
| 6,990,205 | B1 * | 1/2006 | Chen | 381/17 |
| 7,076,315 | B1 * | 7/2006 | Watts | 700/94 |
| 2005/0141733 | A1 * | 6/2005 | Blamey et al. | 381/312 |

OTHER PUBLICATIONS

Eric Fragniere et al. Design of an Analogue VLSI Model of an Active Cochlea. Analog Integrated Circuits and Signal Processing. May-Jun. 1997. Kluwer Academic Pulishers, Netherlands. vol. 13, No. 1-2.*

"Design of an Analogue VLSI Model of an Active Cochlea," Fragniere et al. *Analog Integrated Circuits and Signal Processing*. May-Jun. 1997. Kluwer Academic Publishers, Netherlands. vol. 13, No. 1-2.

(Continued)

*Primary Examiner*—Vivian Chin
*Assistant Examiner*—Devona E. Faulk
(74) *Attorney, Agent, or Firm*—Gauthier & Connors LLP

(57) ABSTRACT

In accordance with an embodiment, the invention provides a spectral enhancement system that includes a plurality of distributed filters, a plurality of energy distribution units, and a weighted-averaging unit. At least one of the distributed filters receives a multi-frequency input signal. Each of the plurality of energy-detection units is coupled to an output of at least one filter and provides an energy-detection output signal. The weighted-averaging unit is coupled to each of the energy-detection units and provides a weighted-averaging signal to each of the filters responsive to the energy-detection output signals from each of the energy-detection units to implement distributed gain control. In an embodiment, the energy detection units are coupled to the outputs of the filters via a plurality of differentiator units.

19 Claims, 6 Drawing Sheets

OTHER PUBLICATIONS

"Silicon Cochlea and its adaptation to spatial localization," Grech et al. *IEE Proc.-Circuits Devices Syst.* Apr. 1999. vol. 146, No. 2.

"ASIC Implementation of the Lyon Cochlea Model," Summerfield et al. *Digital Signal Processing 2, Estimation, VSLI.* San Francisco, CA. Mar. 1992.

"A Low-Power Wide Dynamic-Range Analog VLSI Cochlea," Sarpehskar et al. *Analog Integrated Circuits and Signal Publishing*. 1998. Kluwer Academic Publishers, Boston, MA.

"Energy-Efficient Adaptive Signal Decomposition: The Silicon and Biological Cochlea," Rahul Sarpeshkar. *Proceedings of the 1999 IEEE International Symposium on Circuits and Systems*. May-Jun. 1999. Orlando, Florida.

"A Computational Cochlear Nonlinear Preprocessing Model with Adaptive Q Circuits," Hirahara et al. *ICASSP*, 1989. p. 496-499.

Sarpeshkar et al., "A Low-Power Wide-Dynamic-Range Analog VLSI Cochlea," *Analog Integrated Circuits and Signal Processing*, vol. 16, (1998): 245-274.

Sarpeshkar, R., "Traveling Waves Versus Bandpass Filters: The Silicon and Biological Cochlea," submitted to *World Scientific*, (Dec. 10, 1999).

Lyon, R.F., "Filter Cascades As Analogs of the Cochlea," *Analog Integrated Circuits and Signal Processing*, vol. 12, (1997): 9-17.

Stone et al., "Comparison of different forms of compression using wearable digital hearing aids," *Acoustical Society of America*,vol. 106(6), (Dec. 1999): 3603-3619.

Wang et al., "A Low Power Analog Front-end Module for Cochlear Implants," 970302/746674/C/724 1997.

* cited by examiner

SYSTEM AND METHOD FOR DISTRIBUTED GAIN CONTROL

PRIORITY

The present application claims priority to U.S. Provisional Patent Application Ser. No. 60/398,253 filed Jul. 24, 2002.

BACKGROUND

The invention generally relates to spectral enhancement systems for enhancing a spectrum of multi-frequency signals (e.g., acoustic, electromagnetic, etc.), and relates in particular to spectral enhancement systems that involve filtering and amplification.

Conventional spectral enhancement systems typically involve filtering a complex multi-frequency signal to remove signals of undesired frequency bands, and then amplifying the filtered signal in an effort to obtain a spectrally enhanced signal that is relatively background free.

In many systems, however, the background information may be difficult to filter out based on frequencies alone because the complex multi-frequency signal may include background noise that is close to the frequencies of the desired information signal. Moreover, many conventional spectral enhancement systems inadvertently amplify some background noise with the amplification of the desired information signal.

For example, a spectral enhancement system may include one or more band pass filters into which an input signal is received, as well as one or more compression and/or amplification units, the outputs of which are combined at a combiner to produce an output signal. If the frequencies of the desired signals, for example, vowel sounds in an auditory signal are either within a band filtered frequency or are surrounded by substantial noise signals in the frequency spectrum, then such a filter and amplification system may not be sufficient in certain applications.

As a particular example of a spectral enhancement system, an electronic cochlea models the traveling-wave amplifier architecture of a biological cochlea as a cascade of nonlinear-and-adaptive second-order filters with corner frequencies that decrease exponentially from approximately 10 kHz to 100 Hz. Due to the successive compounding of gains, a change in the individual filter gains of a few percent can alter the gain of the composite transfer function by many orders of magnitude. For example, $(1.1)^{45}=73$ while $(0.9)^{45}=0.009$. It is very difficult to accomplish such wide-dynamic-range gain control with one localized amplifier without changing the amplifier's bandwidth, temporal resolution, and power dissipation drastically. Any parameter variations in the Q's of the various cochlear filters, which can result in inhomogenities and non-robust or unstable operation, are compensated for through gain control. Any physical biological system, such as the cochlea, must possess a feedback system to ensure that it works in a real-world environment, where parameters are not perfectly matched and controlled to high precision as in current digital implementations or simulations.

Distributed gain control and the traveling-wave phenomena are important aspects of the silicon cochlea (as disclosed in *A Low-Power Wide-Dynamic Range Analog VLSI Cochlea*, Sarpeshkar, R., Lyon, R. F., and Mead, C. A., Analog Integrated Circuits and Signal Processing (1998), the disclosure of which is hereby incorporated by reference) in replicating the performance of the biological cochlea. The silicon cochlea's importance to cochlear implant processing is significant for at least the following reasons.

1) An exponentially tapering filter-cascade architecture provides an extremely efficient mechanism for constructing a bank of closely spaced high-order filters as disclosed in *Traveling Waves versus Bandpass Filters: The Silicon and Biological Cochlea*, Sarpeshkar, R., Proceedings of the International Symposium on Recent Developments in Auditory Mechanics, World Scientific (2000), and *Filter Cascades as Analogs of the Cochlea*, Lyon, R. F., Neuromorphic Systems Engineering (1998), the disclosures of which are both hereby incorporated by reference. As the number of channels in implants continues to grow (e.g., 31 channel implants, 64-channel implants, 128-channel implants etc.), the advantages of filter cascades in creating a bank of high-order filters will become more and more apparent.

2) A sophisticated frequency-dependent version of the gain control algorithms presently used in implants and hearing aids may be implemented as disclosed in *Comparison of Different Forms of Compression in Wearable Digital Hearing Aids*, Stone, M. A., Moore, B. C. J., Alcantara, J. I., and Glasberg, B. R., J. Acoustic Society of America, (1999), the disclosure of which is hereby incorporated by reference. Thus loud sounds at one frequency do not have to result in inaudible sounds at another frequency. Also, the gain control allows important phenomena in the perception of speech in noise such as forward masking to be easily modeled. Gain control has been shown to be particularly important in the performance of speech recognition systems in reverberant and noisy environments.

3) The architecture of the cochlea is amenable to both time and place coding as described in *A Low-Power Analog Front-end Module for Cochlear Implants*, Wang, R. J. W, Sarpeshkar, R, Jabri, M. and Mead, C. XVI World Congress on Otorhinolaryngology (1997), the disclosure of which is hereby incorporated by reference.

4) The biological realism allows several important phenomena in biology to be naturally replicated. These include filter broadening with level, the distributed coding of loudness, the transition from place cues to time cues as level increases, redundant signal representations, the close intertwining of both filtering and compression rather than the artificial separation of filtering and compression in today's implants, compression of long-term information while preserving good sensitivity to transients, two-tone suppression, the upward spread of masking, and forward masking. Although it is quite possible that none of these effects have any importance for implant patients, given that cochlear front ends have been shown to improve speech recognition in noise it is unlikely that models closer to the biology will have no impact on implant patients. It is also likely that coding strategies that are closer to the biology will prove superior to those that are not.

5) The silicon cochlea's analog circuit techniques provide a foundation for ultra-low-power cochlear implant design.

The silicon cochlea may be implemented as a particular form of local feedforward gain control as disclosed in *A Low-Power Wide-Dynamic Range Analog VLSI Cochlea* discussed above. Such an implementation, however, generates input-output curves that are too compressive as compared with those in a real cochlea. Such curves are not suitable for direct use in cochlear implants. Furthermore, such curves cannot easily be programmed to implement a desired compression characteristic, an important necessity in a practical system.

There is a need therefore, for an improved spectral enhancement system that is efficient and practical.

SUMMARY OF THE ILLUSTRATED EMBODIMENTS

In accordance with an embodiment, the invention provides a spectral enhancement system that includes a plurality of distributed filters, a plurality of energy distribution units, and a weighted-averaging unit. At least one of the distributed filters receives a multi-frequency input signal. Each of the plurality of energy-detection units is coupled to an output of at least one filter and provides an energy-detection output signal. The weighted-averaging unit is coupled to each of the energy-detection units and provides a weighted-averaging signal to each of the filters responsive to the energy-detection output signals from each of the energy-detection units to implement distributed gain control. In an embodiment, the energy detection units are coupled to the outputs of the filters via a plurality of differentiator units.

BRIEF DESCRIPTION OF THE DRAWINGS

The following description may be further understood with reference to the accompanying drawings in which.

The drawings are shown for illustrative purposes only and are not to scale.

DETAILED DESCRIPTION OF THE ILLUSTRATED EMBODIMENTS

It has been discovered that a system may be developed to provide an efficient spectral enhancement system by employing a bank of wide-dynamic-range frequency-analysis channels. Such a system may be created using hardware circuit components (e.g., electronic, optic or pneumatic), using software, or using any other simulation routine such as the MATLAB program sold by Math Works, Inc. of Natick, Mass.

For example, in an auditory enhancement or replacement systems for humans, an electronic cochlea maps the traveling-wave architecture of the biological cochlea into a silicon chip. In both biology and electronics gain control is essential in ensuring that the architecture is robust to parameter changes, and in attaining wide dynamic range. A silicon cochlea with distributed gain control is advantageous as a front end in cochlear-implant processors to improve patient performance in noise and to implement the computationally intensive algorithms of the biological cochlea with very low power.

In accordance with an embodiment, the invention provides a computer simulation of a filter-cascade cochlear model with distributed gain control that incorporates several important features such as multi-band compression, an intertwining of filtering and compression, masking, and an ability to tradeoff the preservation of spectral contrast with the preservation of audibility. The gain control algorithm disclosed herein successfully reproduces cochlear frequency response curves, and represents an example of a class of distributed-control algorithms that could yield similar results. In distributed gain-control systems like the cochlea, each individual filter does not change its gain appreciably although the collective system does change its gain appreciably. Thus, a system may maintain its bandwidth, temporal resolution, and power dissipation to be relatively invariant with amplitude.

Figure 1:
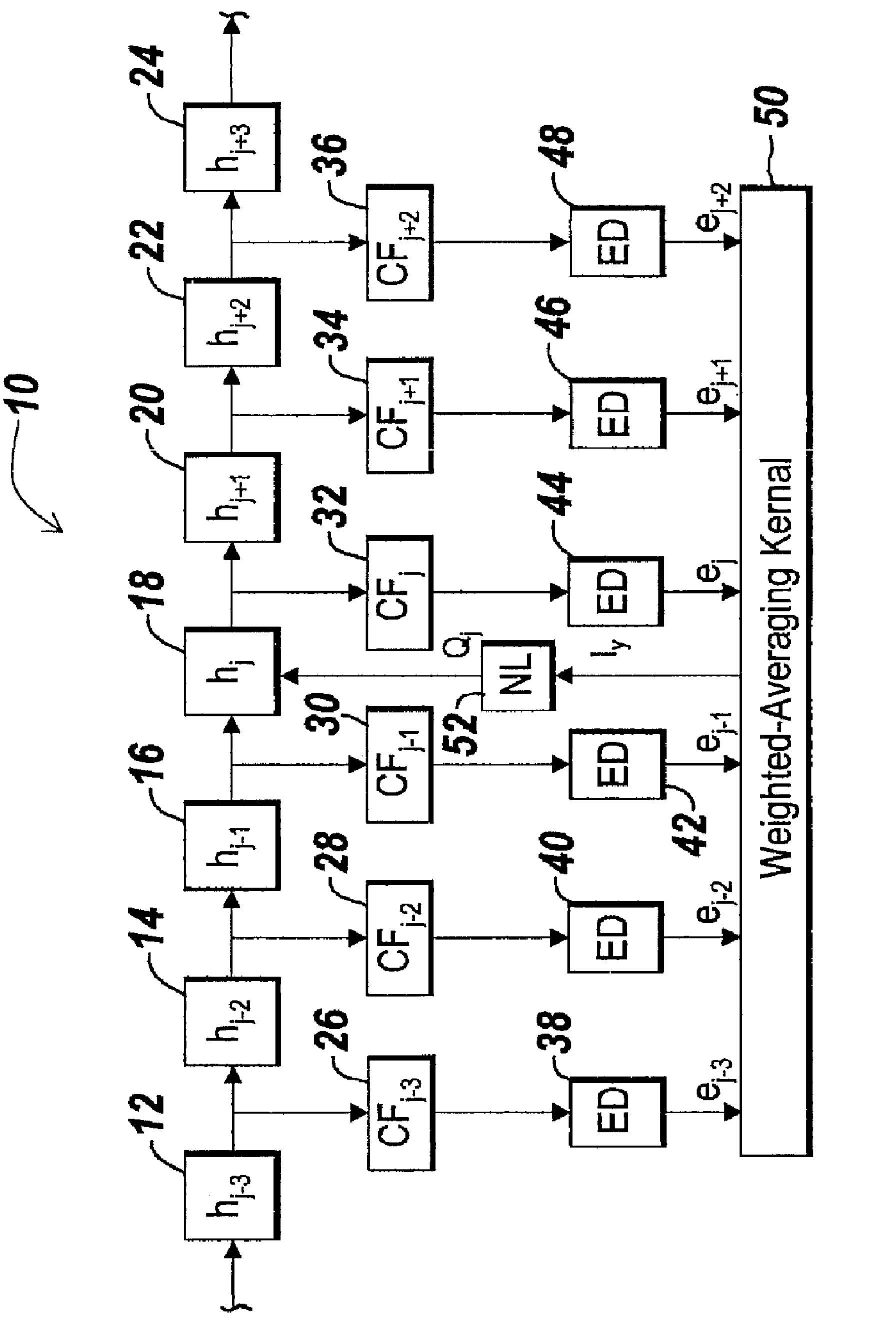
FIG. 1 shows an illustrative diagrammatic schematic view of a portion of a system in accordance with an embodiment of the invention.

FIG. 1 shows a schematic architecture 10 for implementing a distributed-gain-control system in a silicon cochlea in accordance with an embodiment of the invention. In certain embodiments, it is desired to obtain a gain-control strategy that functions well for use in cochlear-implant processors. The system is shown for a single second order section $h_j$ (18) with the neighboring second order sections being designated $h_{j-1}$ (16), $h_{j-2}$ (14), $h_{j-3}$ (12), $h_{j+1}$ (20), $h_{j+2}$ (22), $h_{j+3}$ (24). The output signals from each the sections 12-24 are optionally coupled to a plurality of differentiators 26-36 as shown and provided to a plurality of independent energy detection units 38-48. The outputs of the energy-detection units 38-48 are coupled to a weighted averaging kernel 50, and the kernel 50 provides a weighted averaging signal $I_j$ to a non-linearity unit 52, which in turn provides a $Q_j$ signal to the second order section $h_j$. Each of the second order sections 12-24, therefore, is provided a Q signal that is generated by the kernel 50 and non-linearity unit 52 to be responsive to energy-detection signals from each of the sections 12-24. The sections 12-24 each generally perform a filtering function, and may for example, provide a low pass, band pass or high pass filter function.

During operation, the cascaded resonant second-order sections 12-24 may provide low pass filter functions and have characteristic frequencies ($CF_j$) that are exponentially tapered from the beginning of the cascade to the end of the cascade. The outputs from the resonant low pass second-order sections 12-24 are double differentiated in the $(jw/CF_j)^2$ blocks 26-36 to create CF-normalized bandpass frequency-response characteristics at each stage of the silicon cochlea. In other embodiments, the differentiation 26-36 may provide a unity differentiator function. The envelope energy in each of these stages is extracted by the envelope-detector (ED) blocks 38-48 and fed to a kernel that computes a spatially-filtered version of these energies. The kernel 50 weights local energies more strongly than energies from remote stages. The output of the kernel, $I_j$, is then passed through nonlinear block, $NL_j$ (52). The NL block outputs a large value for the resonant gain, $Q_j$, if the energy is low, and a small value for $Q_j$, if the energy is high, thus, performing gain control. The attack and release dynamics of the gain control arise from charging and discharging time constants in the envelope detector respectively, and may be tapered with the CF's of the cochlear stages. For clarity, the architecture is only shown in detail for stage j of the cascade, but every stage of the cascade has similar $NL_j$ blocks that operate on local estimates of envelope energy output by the kernel.

The weighted-averaging at any local filter is a function of the of the energy outputs of each of the other filters as well as the local energy output and may be generally represented as follows:

$$I_j=F_j(\ldots, e_{j-3}, e_{j-2}, e_{j-1}, e_j, e_{j+1}, e_{j+2}, e_{j+3}, \ldots) \tag{1}$$

A specific example of the equations that describe distributed gain control in accordance with an embodiment of the invention are disclosed in the equations below to describe the spatial weight-averaging kernel and non-linearity unit:

Spatial kernel:

$$I_j = \sum_{i=1}^{N} w_i^j e_i \tag{2}$$

NL:

$Q_j = Q_{max}$ for $I_j \leq K$ and $$Q_j = \frac{(Q_{\max} - Q_{\min})}{(I_j / K)^z} + Q_{\min} \text{ for } I_j > K \tag{3}$$

The weights of the kernel are given by $w_i^j$. The parameters $Q_{max}$ and $Q_{min}$ determine the maximum and minimum Q settings of a cochlear stage. The value K determines the knee of the cochlear compression characteristic, and z determines the power law of the compression characteristic. A large K implies that the gain control is activated only at large intensities. A large z means that the compression characteristic obeys a small power law, and is relatively flat with intensity. The spatial extent of the kernel, $Q_{max}$, and $Q_{min}$ determine whether the gain control is broadband and preserves spectral contrast (large spatial-extent kernels and small Q's) or whether it is narrowband and preserves audibility (small spatial-extent kernels and large Q's).

Figure 2A:
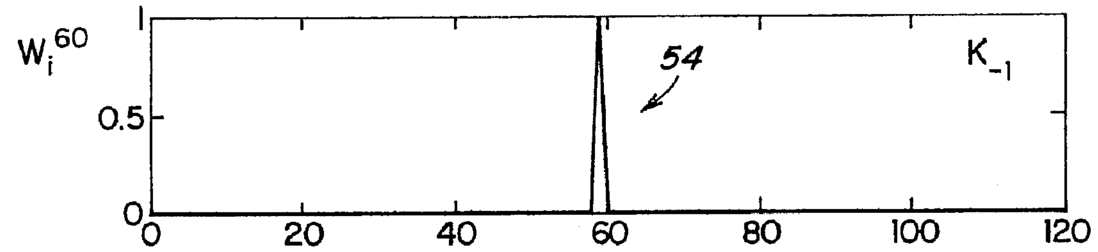
FIGS. 2A-2C show illustrative diagrammatic graphical views of spatial kernels for implementing distributed gain control in accordance with systems of various embodiments of the invention.
Figure 2B:
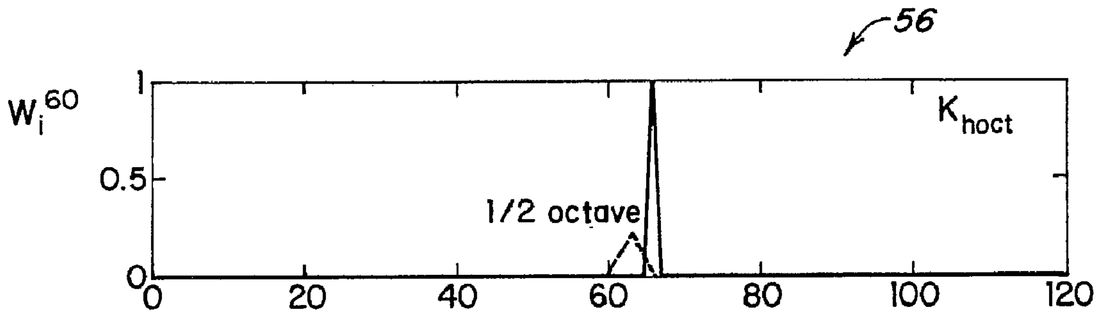
Figure 2C:
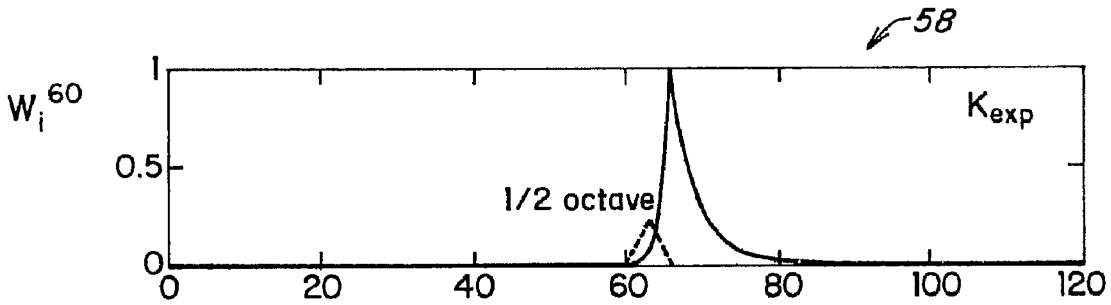

FIGS. 2A-2C show three examples of kernels for use in various embodiments of the invention. The kernels are shown for the Q control of stage 60. The kernel shown at 54 in FIG. 2A, labeled $K_{-1}$ is a purely feedforward kernel with gain control inputs arising from only the stage previous to that being controlled. The kernel shown at 56 in FIG. 2B, labeled $K_{hoct}$, has inputs to the gain control arising from only stages a half octave ahead of the stage being controlled. The kernel shown at 58 in FIG. 2C is a purely feedback kernel. Stages that are a one-half octave ahead are the most strongly affected by the local stage's gain always, independent of the gain control. The kernel shown in FIG. 2C, labeled $K_{exp}$, has exponential weighting for stages beyond a one-half octave and before a one-half octave of the stage being controlled. Each of the kernels has various pros and cons. $K_{-1}$ is simple and fast and has no stability issues. The kernel $K_{hoct}$ may result in instability in the gain control if the adaptation time constants are too fast. A cascade architecture that incorporates complex zeros to reduce the group delay in the second order sections may help improve the stability and speed of adaptation tradeoff in schemes using $K_{hoct}$. The kernel $K_{exp}$ behaves similar to $K_{hoct}$ but the resulting gain control and masking are more broadband. Interesting results may be obtained for a $K_{-1}$ kernel using MATLAB simulations.

Figure 3:
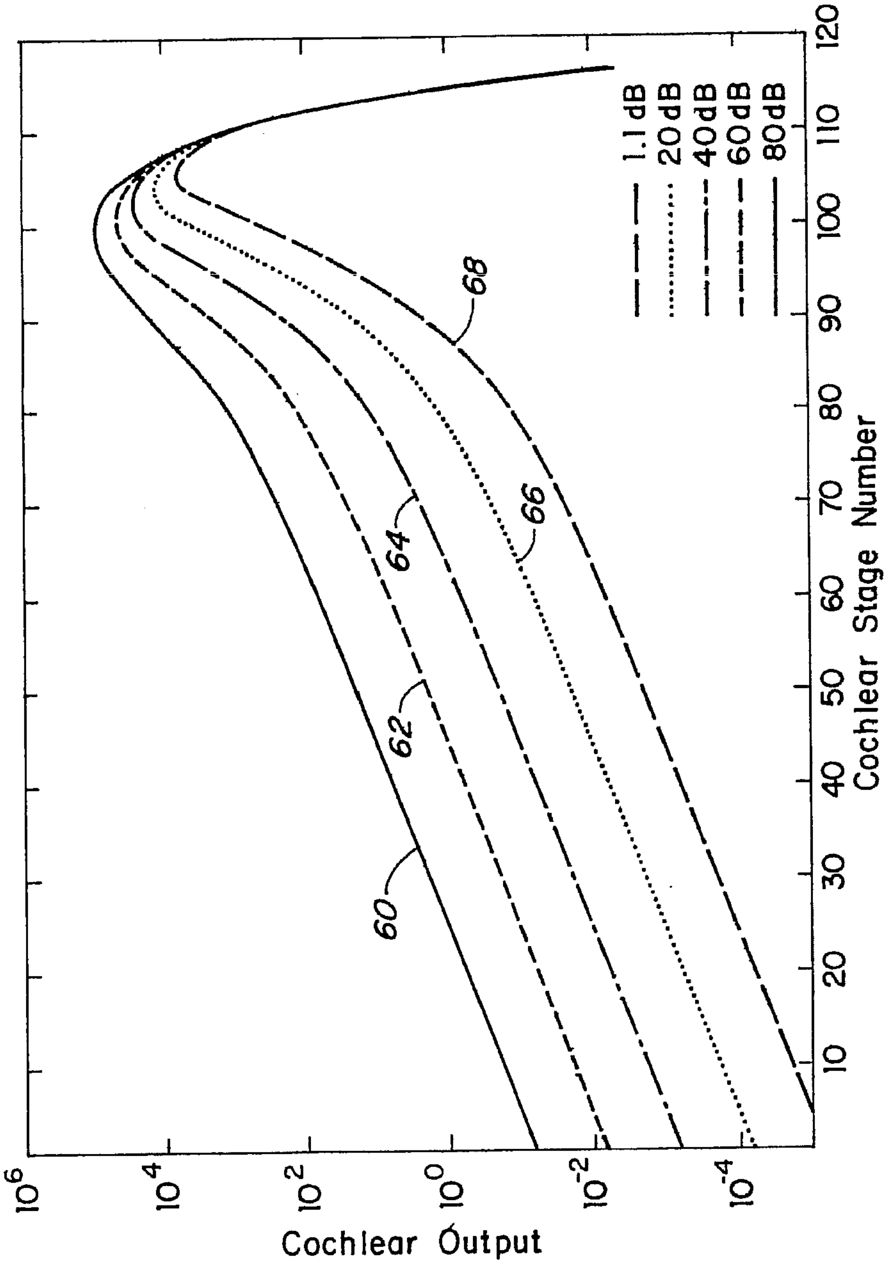
FIG. 3 shows an illustrative diagrammatic graphical view of response characteristics of systems of various embodiments of the invention at various amplitudes for single tone stimulations.

As shown in FIG. 3, the cochlear frequency response curves at various intensities (1.1 dB, 20 dB, 40 dB, 60 dB and 80 dB) are shown (at 60, 62, 64, 66, and 68 respectively). FIG. 3 shows pure-tone cochlear response characteristics at various intensities for a cascade with 24 filters per octave, a $Q_{min}$ of 0.7, a $Q_{max}$ of 1.2, a $K_{-1}$ kernel, and parameters of K=1000 and z=0.4. The adaptation and broadening in resonant gain, compression, and peak shifts are all evident. FIG. 3 shows that in response to a pure tone at various intensities, 1) the peak is broadened, 2) the peaks are compressed, and 3) the peaks shift to the left as the signal intensity is increased.

Figure 4A:
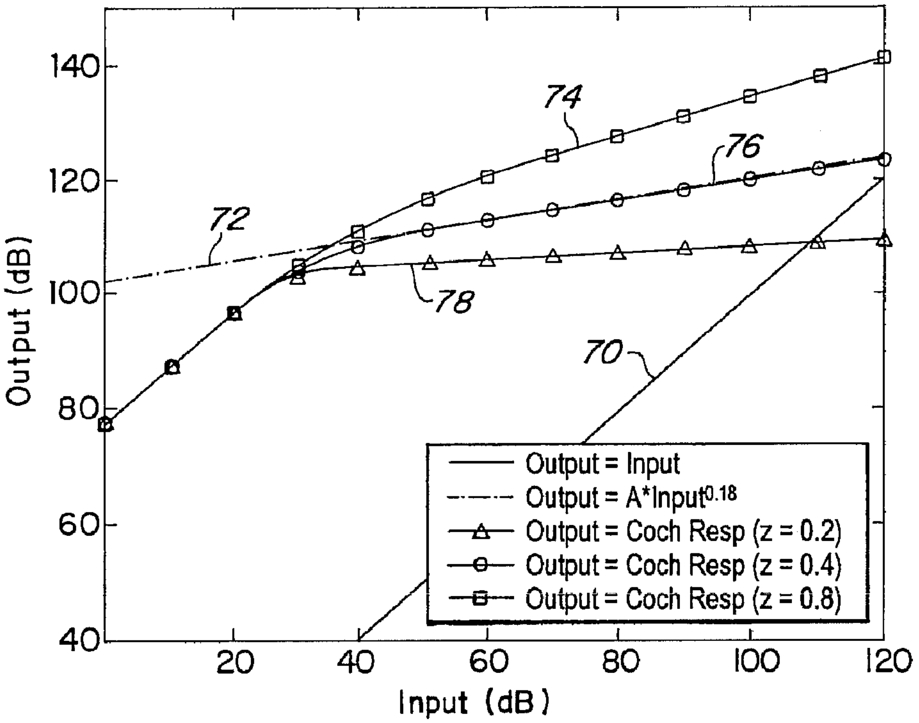
FIGS. 4A and 4B show illustrative diagrammatic graphical views of input-output transfer functions for different values of the power law of the compression characteristic.
Figure 4B:
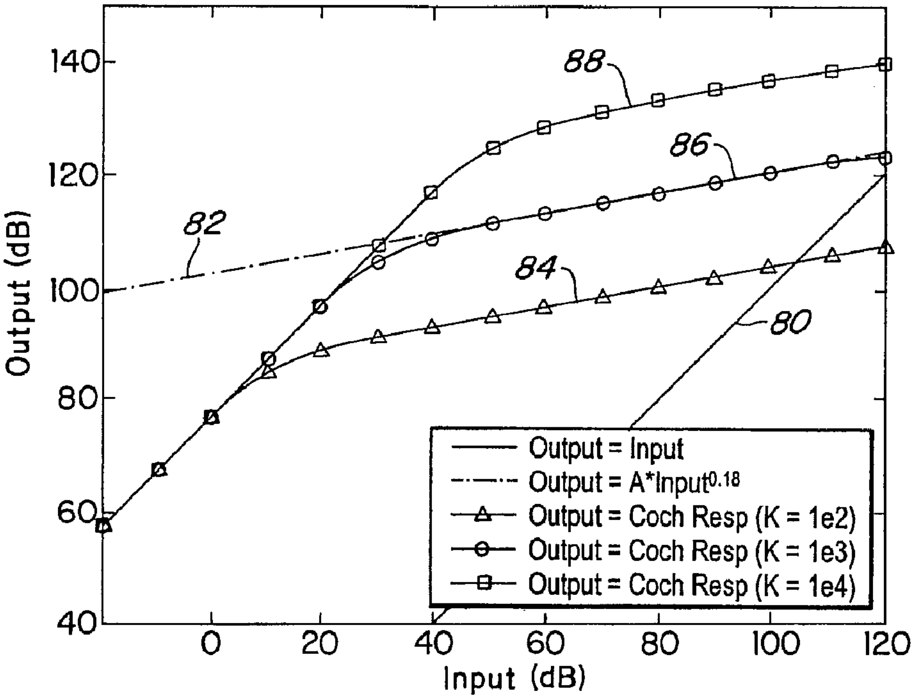
Figure 5A:
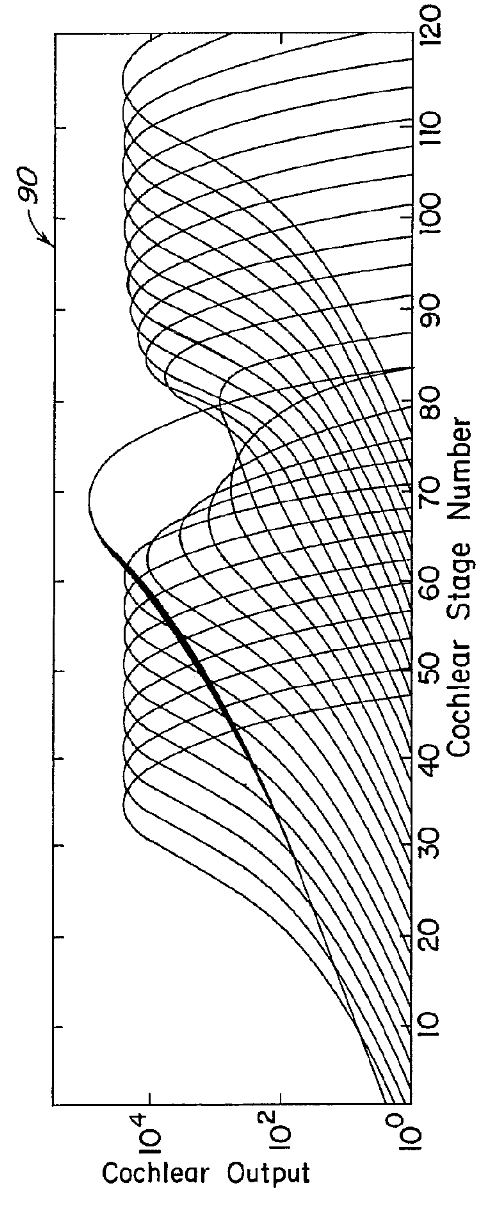
FIGS. 5A and 5B show illustrative diagrammatic graphical views of spatial responses for two-tone stimulations for different frequencies of the non-dominant tones.
Figure 5B:
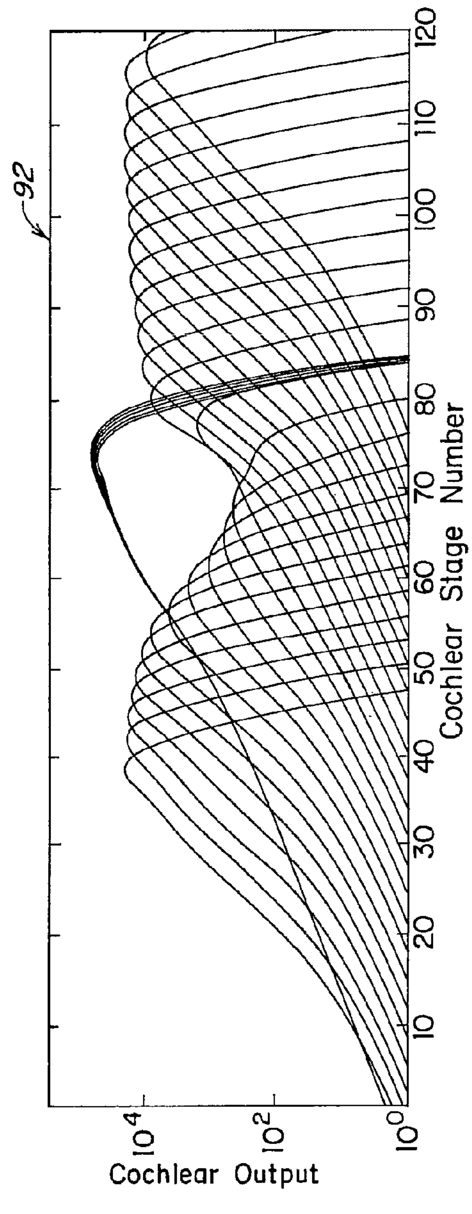

Input-output curves are shown in FIG. 4A for output=input, output=A*input$^{0.18}$, output=Coch Resp with z=0.2 in Equation (3) above, output=Coch Resp with .z=0.4, and output=Coch Resp with z=0.8 at 70, 72, 74, 76 and 78 respectively. FIG. 4A shows that as z is varied, the power law of the compression characteristic at the best frequency (BF) may be changed. FIG. 4(B) shows that as we vary K, the knee of the compression characteristic at the best frequency is changed. The input-output curves for output=input, output=A*input$^{0.18}$, output=Coch Resp (K=1e2), output=Coch Resp (K=1e3), and output=Coch Resp (K=1e4) are shown in FIG. 4B at 80, 82, 84, 86 and 88 respectively. FIG. 4B shows a compression characteristic of an algorithm in accordance with an embodiment of the invention FIGS. 5A and 5B shows the cochlear spatial responses 90 and 92 respectively for a two-tone stimulation as the frequency of the nondominant tone is varied with respect to the dominant tone. FIG. 5A shows the masking phenomena for two-tone stimulation due to gain control for a $K_{-1}$ kernel, and FIG. 5B shows the masking phenomena for two-tone stimulation due to gain control for a $K_{exp}$ kernel. These figures demonstrate that the model in accordance with an embodiment performs a two-tone suppression with a winner-take-all behavior (i.e., the smaller of the two tones is suppressed).

Figure 6A:
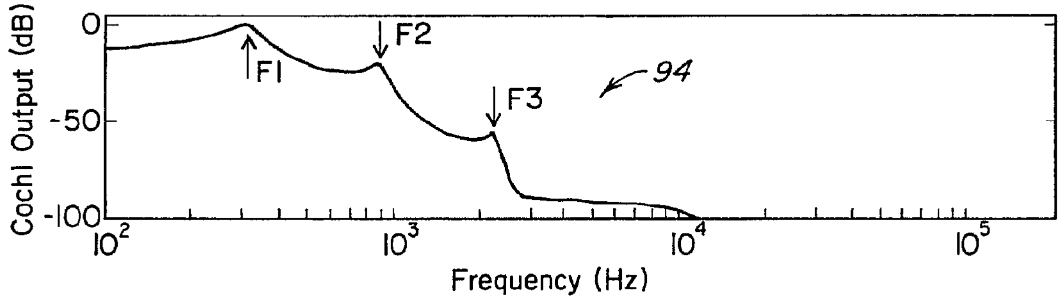
FIG. 6A shows an illustrative diagrammatic graphical view of a sample spectrum of the phoneme /u/.
Figure 6B:
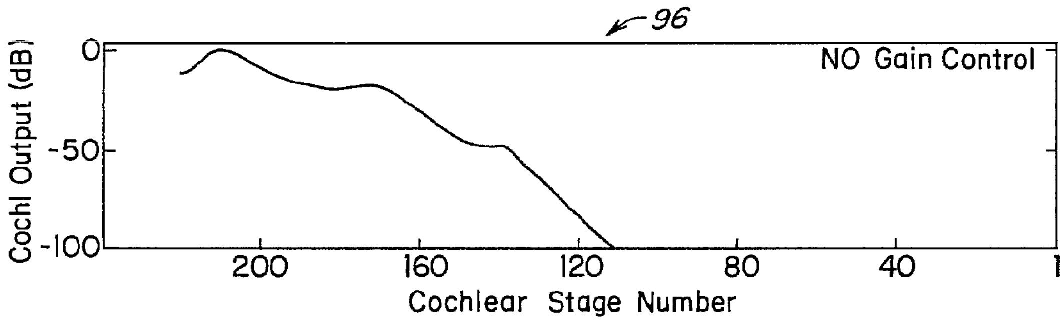
FIGS. 6B-6C show illustrative diagrammatic graphical views of spatial response profiles for the sample of FIG. 6A with and without gain control.
Figure 6C:
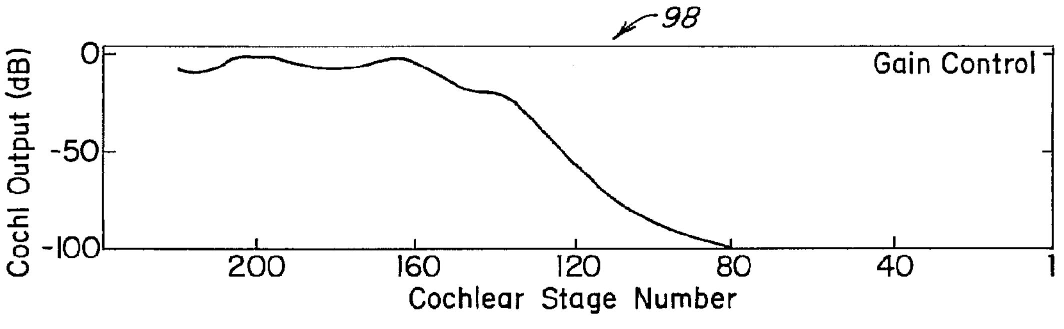

FIGS. 6B-6C show cochlear spatial response profiles with and without gain control for the multi-frequency signal shown in FIG. 6A. FIG. 6A shows at 94 the multi-frequency signal for the phoneme /u/. FIG. 6B shows the spatial response profile 96 of the cochlea when the input is the phoneme /u/ without gain control. FIG. 6C shows the spatial response profile 98 of the cochlea when the input is the phoneme /u/ with gain control. The gain control ensures that all three formants are important in discrimination. As shown in FIG. 6A, the signal 94 includes three distinct peaks F1, F2 and F3 that vary in intensity. When the gain control is on, the three peaks are all at a similar level (equalization) as shown at 98 in FIG. 6C. By comparison, when the gain control is off, the distinctiveness of the peaks F2 and F3 is largely lost in the signal 96 as shown in FIG. 6B.

Those skilled in the art will appreciate that numerous variations and modifications may be made to the above embodiments without departing from the spirit and scope of the claims.

What is claimed is:

1. A spectrum enhancement system comprising:

a plurality of distributed filters, at least one of said filters for receiving a multi-frequency input signal;

a plurality of energy detection units, each of which is coupled to an output of at least one filter and each of which provides an energy detection output signal;

a weighted averaging unit that is coupled to each of said energy detection units and that provides a weighted averaging signal to each of said filters responsive to the energy detection output signals from each of said energy detection units, wherein said plurality of energy detection units are coupled to the output of the filters via a plurality of differentiator units, each of which is coupled to an output of each of said filters and to one of said energy detection unit, wherein said differentiator units provide double differentiator.

2. The system as claimed in claim 1, wherein said weighted averaging signal is a non-linear signal.

3. The system as claimed in claim 1, wherein said energy detection units provide envelope detection.

4. The system as claimed in claim 1, wherein the multi-frequency signal is an auditory signal.

5. The system as claimed in claim 4, wherein said system is used with a cochlear implant.

6. The system as claimed in claim 1, wherein the multi-frequency signal is an electromagnetic signal.

7. The system as claimed in claim 1, wherein said weighted averaging signal is obtained by linear spatial filtering followed by a nonlinear unit.

8. A spectrum enhancement system comprising:

at least two filters $h_j$ and $h_{j+1}$ for receiving a multi-frequency input signal;

at least two energy detection units, each of which is coupled to an output of a filter and each of which provides an energy detection output signal $e_j$ and $e_{j+1}$ respectively; and a weighted-averaging unit that is coupled to each of said energy detection units and that provides a weighted-averaging signal $I_j$ to a non-linear unit responsive to each of said energy detection output signals $e_j$ and $e_{j+1}$;

said non-linear unit providing a resonant gain signal $Q_j$ to said filter $h_j$ responsive to said weighted-averaging signal $I_j$.

9. The system as claimed in claim 8, wherein said energy detection units are coupled to the outputs of the filters via a plurality of differentiator units, each of which is coupled to an output of each of said filters and to one of said energy detection units.

10. The system as claimed in claim 8, wherein said differentiator units provide double differentiation.

11. The system as claimed in claim 8, wherein said energy detection units provide envelope detection.

12. The system as claimed in claim 8, wherein the multi-frequency signal is an auditory signal.

13. The system as claimed in claim 12, wherein said system is used with a cochlear implant.

14. The system as claimed in claim 8, wherein the multi-frequency signal is an electromagnetic signal.

15. The system as claimed in claim 8, wherein said weighted-averaging signal is obtained by linear spatial weighting.

16. A spectrum enhancement system comprising:

a plurality of serially distributed low pass filters, the first of which receives a multi-frequency input signal;

a plurality differentiator units, each of which is coupled to an output of a low pass filter and each of which provides a differentiator output signal;

a plurality of energy detection units, each of which is coupled to an output of a differentiator unit and each of which provides an energy detection output signal;

a weighted averaging unit that is coupled to each of said energy detection units and that provides a weighted averaging signal to each of said low pass filters responsive to the energy detection output signals from each of said energy detection units.

17. A system as claimed in claim 16, wherein said differentiator units provide a double differentiator function.

18. A method of providing spectral enhancement, said method including the steps of:

receiving a multi-frequency signal at a first low pass filter $h_j$ and receiving an output of said first low pass filter at a second low pass filter $h_{j+1}$;

providing a first energy detection signal $e_j$ responsive to the output of said first low pass filter;

providing a second energy detection signal $e_j$ responsive to the output of said second low pass filter;

providing a weighted averaging signal $I_j$ to a non-linear gain unit responsive to each of said energy detection output signals $e_j$ and $e_{j+1}$; and providing a resonant gain signal $Q_j$ to said low pass filter $h_j$ responsive to said weighted averaging signal $I_j$.

19. The method as claimed in claim 18, wherein said method further includes the step of differentiating the output signals from each of said low pass filters $h_j$ and $h_{j+1}$.

* * * * *